United States Patent
Baker

(10) Patent No.: US 6,535,028 B1
(45) Date of Patent: Mar. 18, 2003

(54) DATA BUS FAULT DETECTION CIRCUIT AND METHOD

(75) Inventor: Keith Ronald Baker, Waterloo, IA (US)

(73) Assignee: Deere & Company, Moline, IL (US)

(*) Notice: Subject to any disclaimer, the term of this patent is extended or adjusted under 35 U.S.C. 154(b) by 0 days.

(21) Appl. No.: 09/986,810

(22) Filed: Nov. 12, 2001

(51) Int. Cl.$^7$ ................................................. H03K 5/22
(52) U.S. Cl. .............................. 327/63; 327/74; 327/75; 701/36
(58) Field of Search .............................. 327/63–65, 72, 327/74, 75, 76, 77; 701/36, 39

(56) References Cited

U.S. PATENT DOCUMENTS

| | | | |
|---|---|---|---|
| 4,617,473 A | * 10/1986 | Bingham | 327/63 |
| 4,703,486 A | 10/1987 | Bemis | 371/41 |
| 4,962,501 A | 10/1990 | Byers et al. | 371/51.1 |
| 4,967,344 A | 10/1990 | Scavezze et al. | 364/200 |
| 4,974,144 A | 11/1990 | Long et al. | 364/200 |
| 4,974,150 A | 11/1990 | Long et al. | 364/200 |
| 5,124,990 A | 6/1992 | Williamson | 371/20.6 |
| 5,187,709 A | 2/1993 | Williamson et al. | 370/85.3 |
| 5,278,462 A | * 1/1994 | Wilson | 327/74 |
| 5,406,485 A | 4/1995 | Wise et al. | 701/29 |
| 5,459,732 A | 10/1995 | Wise et al. | 364/426.02 |
| 5,512,890 A | 4/1996 | Everson, Jr. et al. | 340/870.13 |
| 6,124,727 A | 9/2000 | Bridgewater, Jr. et al. | 326/33 |
| 6,151,539 A | 11/2000 | Bergholz et al. | 701/25 |

OTHER PUBLICATIONS

Philips Semiconductors, "Stand alone CAN controllers", date unknown, 2 pages from product web site.
Philips Semiconductors, "PCA82C252—Fault–tolerant CAN transceiver", date unknown, 3 pages from product web site.

* cited by examiner

*Primary Examiner*—Timothy P. Callahan
*Assistant Examiner*—An T. Luu

(57) ABSTRACT

A receiver circuit is connected to a differential serial bus having first and second signal conductors. The receiver circuit includes a fault detection circuit which generates a difference signal representing a difference between a first signal on the first conductor and a second signal on the second conductors. A comparing circuit includes a plurality of comparators for comparing the difference signal, the first signal and the second signal to predetermined voltage levels. The comparing circuit also includes a plurality of logic units coupled to outputs of the comparators. A signal select circuit has a pair of inputs coupled to the first and second conductors, logic inputs coupled to logic outputs of the comparing circuit, and a signal output. The signal select circuit and the comparing circuit cooperate to control communication of the first and second conductors with the signal output as a function of fault conditions on the first and second conductors.

19 Claims, 1 Drawing Sheet

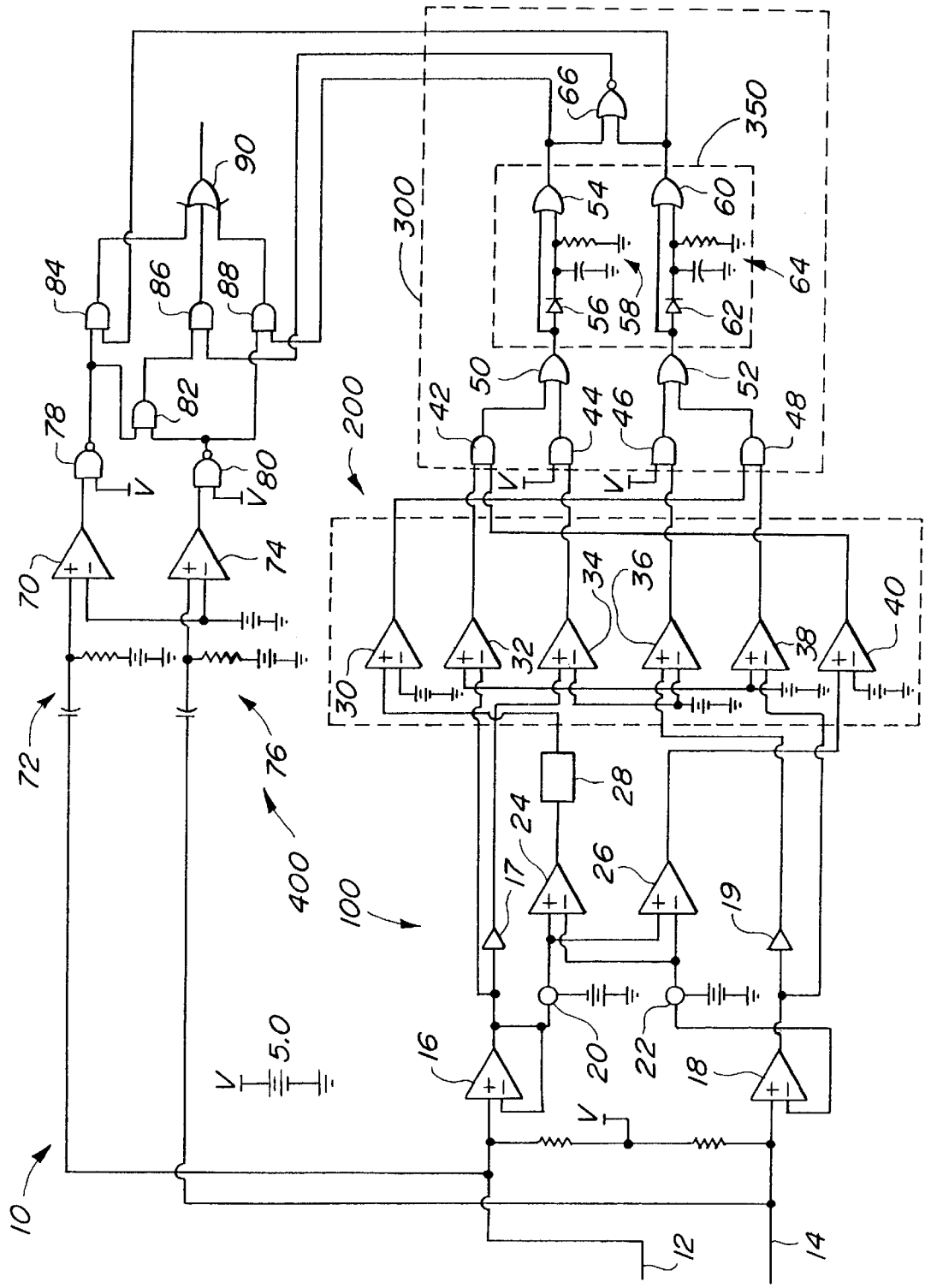

DATA BUS FAULT DETECTION CIRCUIT AND METHOD

BACKGROUND OF THE INVENTION

The present invention relates to a receive circuit for a differential serial bus, such as a CAN ("Controller Area Network") bus system.

A CAN bus is a known simple differential serial bus system which utilizes a known serial communication protocol and which supports distributed real-time control and multiplexing. A CAN bus is capable of operating in noisy electrical environments with a high level of data integrity, and its open architecture and user-definable transmission medium make it extremely flexible. Typical applications of CAN-based networks can be found in automotive and industrial environments. In a particular implementation of a CAN bus system, the bus consists of a four conductor bus which includes a CAN-HI signal conductor, a CAN-LOW signal conductor, a power conductor and a ground conductor. Electronic control units are connected to the bus via transmitter/receiver (transceiver") circuits, such as are commercially available from manufacturers such as Philips Semiconductors.

With known commercially available transceivers, certain fault conditions can interfere with the transmission of information over a CAN bus. Such fault conditions would include a signal conductor being shorted to ground or to power, or when either signal conductor is open. It is known to test for such fault conditions by monitoring voltage levels. However, such voltage monitoring may not detect a short to ground fault condition because the voltage resulting from a short to ground condition may lie within the range of the common mode voltage. Accordingly, a differential serial bus receiver which can detect and respond to such fault conditions is desired.

SUMMARY

Accordingly, an object of this invention is to provide a system for detecting and overcoming fault conditions in a differential serial bus system.

This and other objects are achieved by the present invention, wherein a receiver circuit is connected to a differential serial bus having first and second signal conductors. The receiver circuit includes a fault detection circuit which generates a difference signal representing a difference between a first signal on the first conductor and a second signal on the second conductors. A comparator/logic circuit includes a plurality of comparators for comparing the difference signal, the first signal and the second signal to predetermined voltage levels. The comparator/logic circuit also includes a plurality of logic units coupled to outputs of the comparators. A signal select circuit has a pair of inputs coupled to the first and second conductors, logic inputs coupled to logic outputs of the comparing circuit, and a signal output. The signal select circuit and the comparing circuit cooperate to control communication of the first and second conductors with the signal output as a function of fault conditions on the first and second conductors.

BRIEF DESCRIPTION OF THE DRAWINGS

The sole FIGURE is a circuit diagram of a differential serial bus receive circuit according to the present invention.

DETAILED DESCRIPTION

The CAN bus receive circuit 10 is connected to the CAN-HI signal conductor 12 and to the CAN-LOW signal conductor 14 of a conventional four conductor CAN bus. The receive circuit 10 includes a fault detection circuit 100, a comparator circuit 200, a signal receive control circuit 300 and a signal receive circuit 400.

The fault detection circuit 100 includes a first summing unit 20 which has an output, a first input coupled to the high signal conductor 12 via unity gain op amp 16, and a second input connected to a negative 0.6 V reference voltage. Fault detection circuit 100 also includes a second summing unit 22 having an output, a first input coupled to the low signal conductor 14 via unity gain op amp 18 and a second input connected to a positive 0.6 V reference voltage. The outputs of amps 16 and 18 are also coupled to the inputs of respective 0.5 gain amplifiers 17 and 19. The 0.6 volt is added and subtracted to the signals to allow them to cross over each other in a symmetrical manner.

Circuit 100 includes a first difference unit 24 with an output, a plus input coupled to the output of the first summing unit 20 and having a minus input coupled to the output of the second summing unit 22. Circuit 100 further includes a second difference unit 26 having an output, having a minus input coupled to the output of the first summing unit 20 and having a plus input coupled to the output of the second summing unit 22. A peak detector 28 is coupled to the output of the first difference unit 24 and outputs the peak voltage detected thereby over a time period, such as 50 microseconds. Thus, the circuit 100 receives the CAN_LOW and CAN_HI signals, generates a pair of difference signals therefrom, and communicates the difference signals and the CAN_LOW and CAN_HI signals to a comparator/logic circuit 200.

The comparing or logic circuit 200 includes a first comparator 30 having a first or plus input coupled to the output of peak detector 28 and a second or minus input which receives a first reference voltage of 1.25 volts, for example. Thus, the output of comparator 30 will be high when the output of peak detector 28 is greater than 1.25 volts. A second comparator 32 has a first or plus input which receives a second reference voltage of 0.25 volts and a second or minus input which receives the high signal via op amp 16. Thus, the output of comparator 32 will be high when the output of op amp 16 is less than 0.25 volts. A third comparator 34 has a first or plus input coupled to the high signal via op amp 16 and amplifier 17, and a second or minus input which receives a third reference voltage of 2.4 volts. Thus, the output of comparator 34 will be high when the output of amplifier 17 is greater than 2.4 volts. A fourth comparator 36 has a first or plus input which receives the low signal via op amp 18 and amplifier 19, and a second or minus input which receives the 2.4 volt reference voltage. Thus, the output of comparator 36 will be high when the output of amplifier 19 is greater than 2.4 volts. A fifth comparator 38 has a first or plus input which receives the second reference voltage and a second or minus input which receives the low signal via op amp 18. Thus, the output of comparator 38 will be high when the output of op amp 18 is less than 0.25 volts. A sixth comparator 40 has a first or plus input coupled to the output of difference unit 26 and a second or minus input which receives the first reference voltage of 1.25 volts. Thus, the output of comparator 40 will be high when the output of difference unit 26 is greater than 1.25 volts.

A signal receive control circuit 300 includes a first AND gate 42 having an output, a first input coupled to the output of the second comparator 32, and a second input coupled to an output of the sixth comparator 40. A second AND gate 44 has an output, a first input coupled to supply voltage Vcc, and a second input coupled to an output of the third comparator 34. A third AND gate 46 has an output, a first input coupled to the Vcc voltage, and a second input coupled to the output of the fourth comparator 48. A fourth AND gate has an output, a first input coupled to the output of the first comparator 30, and a second input coupled to an output of the fifth comparator 38. A first OR gate 50 has an output, a first input coupled to the output of the first AND gate 42, and a second input coupled to the output of the second AND gate 44. A second OR gate 52 has an output, a first input coupled to the output of the third AND gate 46, and a second input coupled to the output of the fourth AND gate 48. Thus, the comparator circuit compares the differential signals and the CAN_LOW and CAN_HI signals to a plurality of reference voltages, and communicates the comparator outputs to a set of logic AND gates and OR gates.

The signal receive control circuit 300 also includes a delay circuit 350 which includes an OR gate 54 with a first input coupled directly to the output of OR gate 50 and a second input coupled to the output of OR gate 50 via a diode 56 and a low pass filter 58. An OR gate 60 has a first input coupled directly to the output of OR gate 52 and a second input coupled to the output of OR gate 52 via a diode 62 and a low pass filter 64. A NOR gate 66 has one input coupled to the output of OR gate 54 and an input coupled to the output of OR gate 60. OR gate 54 generates a control_rxlow output signal, Or gate 60 generates a control_rxhigh output signal, and NOR gate 66 generates a control_rxsum output signal.

As a result, if no fault occurs on the CAN_LOW and CAN_HI conductors, control_rxsum=1, control_rxiow=0 and control$_{rxhigh}$=0. If a fault occurs on the CAN_HI conductor, control_rxlow=1, control$_{rxsum}$=0, and control_rxhigh=0. If a fault occurs on the CAN_LOW conductor, control$_{rxhigh}$=1, control$_{rxiow}$=0 and control$_{rxsum}$=0. If both the CAN_LOW and CAN_HI conductors are open, control_rxsum=0, control_rxiow=1 and control_rxhigh=1.

The signal select circuit 400 includes a first comparator 70 having an output, a first or plus input coupled to the high signal conductor 12 via a high pass filter 72 and a second or minus input connected to a reference voltage, 2.5 volts for example. A second comparator 74 has an output, a first or minus input coupled to the low signal conductor 14 via a high pass filter 76 and has a second or plus input connected to the reference voltage. A first inverter 78 is coupled to the output of the first comparator 70. A second inverter 80 is coupled to the output of the second comparator 74.

A first AND gate 82 has an output, a first input coupled to the output of the first inverter 78, and a second input coupled to an output of the second inverter 80. A second AND gate 84 has an output, a first input coupled to the output of the first inverter 78, and a second input coupled to the output of the third OR gate 54 of the comparator circuit 300. A third AND gate 86 has an output, a first input coupled to the output of the first AND gate 82, and a second input coupled to an output of the NOR gate 66 of comparator circuit 300. A fourth AND gate 88 has an output, a first input coupled to the output of the second inverter 80, and a second input coupled to the output of the fourth OR gate 60 of the comparator circuit 300. An OR gate 90 has an output, a first input coupled to the output of the second AND gate 84, a second input coupled to the output of the third AND gate 86, and a third input coupled to the output of the fourth AND gate 88. OR gate 90 generates a final output signal, rx_output.

As a result, if no fault occurs on the CAN_HI and CAN_LOW conductors, then rx_output will be a digital signal, logically performing an AND function from both the CAN_HI and CAN_LOW conductors 12 and 14. If a fault occurs on the CAN_HI conductor, then rx_output will be a digital signal from only the CAN_LOW conductor 14. If a fault occurs on the CAN_LOW conductor, then rx_output will be a digital signal from only the CAN_HI conductor 12. If both the CAN_LOW and CAN_HI conductors are open, then rx_output will be a constant logic 1.

While the present invention has been described in conjunction with a specific embodiment, it is understood that many alternatives, modifications and variations will be apparent to those skilled in the art in light of the foregoing description. For example, the above described functions could be performed by digitizing the signals and having a programmed computer execute a corresponding algorithm. The functions performed by the comparing circuit 200 could be performed by logic gates. The difference circuits and comparator circuits could be implemented by analog circuits. Accordingly, this invention is intended to embrace all such alternatives, modifications and variations which fall within the spirit and scope of the appended claims.

I claim:

1. A fault detecting receiver circuit for connecting to a differential serial bus, the bus having first and second signal conductors, the receiver circuit comprising:

a fault detection circuit generating a difference signal representing a difference between a first signal on the first conductor and a second signal on the second conductor;

a comparing circuit comparing the difference signal, the first signal and the second signal to predetermined reference signals, the comparing circuit having a plurality of logic units, the logic units having logic outputs; and a signal select circuit having a first input coupled to the first conductor, having a second input coupled to the second conductor, having logic inputs coupled to the logic outputs of the comparing circuit, and having a signal output, the signal select circuit and the comparing circuit cooperating to control communication of the first and second conductors with the signal output as a function of fault conditions on the first and second conductors.

2. The receiver circuit of claim 1, wherein:

the fault detection circuit comprises a pair of difference units.

3. The receiver circuit of claim 2, wherein:

the fault detection circuit further comprises a peak detector coupled between one of the difference units and the comparing circuit.

4. The receiver circuit of claim 1, wherein the comparing circuit comprises:

a first comparator having a first input which receives the difference signal and a second input which receives a first reference voltage;

a second comparator having a first input which receives a second reference voltage and a second input which receives the first signal;

a third comparator having a first input which receives the first signal and a second input which receives a third reference voltage;

a fourth comparator having a first input which receives the second signal and a second input which receives the third reference voltage;

a fifth comparator having a first input which receives the second reference voltage and a second input which receives the second signal; and a sixth comparator having a first input which receives the difference signal and a second input which receives the first reference voltage.

5. The receiver circuit of claim 4, further comprising:

a first AND gate having an output, a first input coupled to an output of the second comparator, and a second input coupled to an output of the sixth comparator;

a second AND gate having an output, a first input coupled to a reference voltage, and a second input coupled to an output of the third comparator;

a third AND gate having an output, a first input coupled to the reference voltage, and a second input coupled to an output of the fourth comparator;

a fourth AND gate having an output, a first input coupled to an output of the first comparator, and a second input coupled to an output of the fifth comparator;

a first OR gate having an output, a first input coupled to the output of the first AND gate, and a second input coupled to the output of the second AND gate;

a second OR gate having an output, a first input coupled to the output of the third AND gate, and a second input coupled to the output of the fourth AND gate; and a NOR gate having an output, a first input coupled to the output of the first OR gate, and a second input coupled to the output of the second OR gate.

6. The receiver circuit of claim 5, further comprising:

a first delay circuit coupled between the output of the first OR gate and the first input of the NOR gate; and a second delay circuit coupled between the output of the second OR gate and the second input of the NOR gate.

7. The receiver circuit of claim 6, wherein the signal select circuit comprises:

a first comparator having an output, a first input coupled to the first conductor via a high pass filter and having a second input connected to a reference voltage;

a second comparator having an output, a first input coupled to the second conductor via a high pass filter and having a second input connected to the reference voltage;

a first inverter coupled to the output of the first comparator;

a second inverter coupled to the output of the second comparator;

a first AND gate having an output, a first input coupled to an output of the first inverter, and a second input coupled to an output of the second inverter;

a second AND gate having an output, a first input coupled to the output of the first inverter, and a second input coupled to the output of the second OR gate;

a third AND gate 86 having an output, a first input coupled to the output of the first AND gate of the signal select circuit, and a second input coupled to an output of the NOR gate;

a fourth AND gate having an output, a first input coupled to the output of the second inverter, and a second input coupled to the output of the first OR gate; and an output OR gate having an output, a first input coupled to the output of the second AND gate of the signal select circuit, a second input coupled to the output of the third AND gate of the signal select circuit, and a third input coupled to the output of the fourth AND gate of the signal select circuit.

8. The receiver circuit of claim 1, wherein the signal select circuit comprises:

a first comparator having an output, a first input coupled to the high signal conductor via a high pass filter and having a second input connected to a reference voltage;

a second comparator having an output, a first input coupled to the low signal conductor via a high pass filter and having a second input connected to the reference voltage;

a first inverter coupled to the output of the first comparator;

a second inverter coupled to the output of the second comparator;

a first AND gate having an output, a first input coupled to an output of the first inverter, and a second input coupled to an output of the second inverter;

a second AND gate having an output, a first input coupled to the output of the first inverter, and a second input coupled to an output of the comparing circuit;

a third AND gate 86 having an output, a first input coupled to the output of the first AND gate, and a second input coupled to an output of the comparing circuit;

a fourth AND gate having an output, a first input coupled to the output of the second inverter, and a second input coupled to an output of the comparing circuit; and an OR gate having an output, a first input coupled to the output of the second AND gate, a second input coupled to the output of the third AND gate, and a third input coupled to the output of the fourth AND gate.

9. The receiver circuit of claim 1, wherein the fault detection circuit comprises:

a first summing unit having an output, having a first input coupled to the first signal conductor, and having a second input connected to a negative reference voltage;

a second summing unit having an output, having a first input coupled to the second signal conductor and having a second input connected to a positive reference voltage;

a first difference unit having an output, having a plus input coupled to the output of the first summing unit and having a minus input coupled to the output of the second summing unit;

a second difference unit having an output, having a minus input coupled to the output of the first summing unit and having a plus input coupled to the output of the second summing unit.

10. The receiver circuit of claim 9, wherein the fault detection circuit further comprises:

a peak detector coupled between the output of the first difference unit and the comparing circuit.

11. The receiver circuit of claim 1, wherein the comparing circuit comprises:

a plurality of comparators, the comparators comparing the difference signal, the first signal and the second signal to predetermined reference signals, the plurality of logic units being coupled to outputs of the comparators.

12. A receiver circuit for connecting to a differential serial bus, the bus having a high signal conductor and a low signal conductor, the receiver circuit comprising:

a fault detection circuit generating a difference signal representing a difference between the high signal and the low signal;

a comparing circuit having a plurality of comparators, the comparing circuit comparing the difference signal, the high signal and the low signal to predetermined voltage levels; and a signal select circuit having a first input coupled to the high signal conductor, having a second input coupled to the low signal conductor having a signal output, and having a plurality of gates coupled between the first and second inputs and the signal output, the gates also being coupled to the comparing circuit, the signal select circuit and the comparing circuit cooperating to communicate a differential signal from the bus to the signal output when no faults occur, to communicate only the high signal to the signal output when a fault is associated with the low signal, to communicate only the low signal to the signal output when a fault is associated with the high signal, and to communicate a fault signal to the signal output when faults are associated with both the low and high signal.

13. A receiver circuit for connecting to a differential serial bus, the bus having first and second signal conductors, the receiver circuit comprising:

a first circuit generating a first signal representing a signal on the first conductor, a second signal representing a signal on the second conductor, and generating a difference signal representing a difference between a first signal and the second signal;

a second circuit generating fault output signals as a function of the difference signal, the first signal and the second signal; and a third circuit coupled to the second circuit and coupled to the first and second conductors, the third circuit controlling communication of the first and second conductors to a signal output as a function of fault output signals.

14. A method of detecting faults on a differential serial bus, the bus having first and second signal conductors, the method comprising:

generating a difference signal representing a difference between a first signal on the first conductor and a second signal on the second conductor;

comparing the difference signal, the first signal and the second signal to predetermined reference signals; and controlling communication of the first and second signals as a function of results of the comparing step.

15. The method of claim 14, further comprising:

detecting a peak value of the difference signal;

comparing the peak value to a reference level; and controlling communication of the first and second signals also as a function of results of comparing the peak value to a reference level.

16. The method of claim 14, further comprising:

comparing the difference signal with a first reference voltage;

comparing the first signal with a second reference voltage;

comparing the first signal with a third reference voltage;

comparing the second signal with the third reference voltage;

comparing the second signal with the second reference voltage; and comparing the difference signal with the first reference voltage.

17. The method of claim 16, further comprising:

performing a first AND operation on a result of comparing the first signal with the second reference voltage and on a result of comparing the difference signal with the first reference voltage;

performing a second AND operation on a reference voltage and on a result of comparing the first signal with the third reference voltage performing a third AND operation on the reference voltage and on a result of comparing the second signal with the third reference voltage performing a fourth AND operation on a result of comparing the difference signal with the first reference voltage and on a result of comparing the second signal with the second reference voltage;

performing a first OR operation on a result of the first AND operation and on a result of the second AND operation;

performing a second OR operation on a result of the third AND operation and on a result of the fourth AND operation; and performing a NOR operation on a result of the first OR operation and on a result of the second OR operation.

18. The method of claim 17, further comprising:

performing a first delay operation between the first OR operation and the NOR operation; and performing a second delay operation between the second OR operation and the NOR operation.

19. The method of claim 18, further comprising:

filtering the first signal with a high pass filter;

comparing the filtered first signal with a reference voltage;

filtering the second signal with a high pass filter;

comparing the filtered second signal with the reference voltage;

performing a first inverting operation upon a result of comparing the filtered first signal with the reference voltage;

performing second inverting operation upon a result of comparing the filtered second signal with the reference voltage;

performing a fifth AND operation 82 on results of the first and second inverting operations;

performing a sixth AND operation on a result of the first inverting operation, and on a result of the second OR operation;

performing a seventh AND operation 86 on a result of the fifth AND operation and on a result of the NOR operation;

performing an eighth AND operation 88 on a result of the second inverting operation and on a result of the second OR operation; and performing an output OR operation on a result of the sixth, seventh and eighth AND operations.

* * * * *